(12) United States Patent
Gutnik (10) Patent No.: US 10,243,544 B1
(45) Date of Patent: Mar. 26, 2019

(54) LIGHT DETECTION WITH LOGARITHMIC CURRENT-TO-VOLTAGE CONVERTER

(71) Applicant: Waymo LLC, Mountain View, CA (US)

(72) Inventor: Vadim Gutnik, Mountain View, CA (US)

(73) Assignee: WAYMO LLC, Mountain View, CA (US)

( * ) Notice: Subject to any disclaimer, the term of this patent is extended or adjusted under 35 U.S.C. 154(b) by 0 days.

(21) Appl. No.: 16/012,509

(22) Filed: Jun. 19, 2018

(51) Int. Cl.
| | |
|---|---|
| *H03K 5/01* | (2006.01) |
| *H03K 5/08* | (2006.01) |
| *H03F 3/08* | (2006.01) |
| *G01J 1/44* | (2006.01) |
| *G01S 7/486* | (2006.01) |
| *G01S 17/89* | (2006.01) |
| *G05F 3/30* | (2006.01) |

(52) U.S. Cl.
CPC ............... *H03K 5/086* (2013.01); *G01J 1/44* (2013.01); *G01S 7/4861* (2013.01); *G01S 17/89* (2013.01); *G05F 3/30* (2013.01); *H03F 3/087* (2013.01); *G01J 2001/4466* (2013.01)

(58) Field of Classification Search
CPC ........... H03K 7/06; H03K 5/086; H03M 1/00; H03M 2201/4212; G05F 1/561; G05F 3/30; H03F 1/3211; H03F 3/087; H03F 3/45179; G01J 1/44; G01J 2011/4466; G01S 7/4861; G01S 17/89
See application file for complete search history.

(56) References Cited

U.S. PATENT DOCUMENTS

| | | | |
|---|---|---|---|
| 5,804,997 A | 9/1998 | Nishizono et al. | |
| 6,495,816 B1 | 12/2002 | Brodeur | |
| 6,504,736 B1 | 1/2003 | Ono | |
| 2013/0234781 A1* | 9/2013 | Bernardinis | G05F 3/30 |
| | | | 327/513 |
| 2014/0247034 A1* | 9/2014 | Lok | G05F 3/02 |
| | | | 323/313 |

OTHER PUBLICATIONS

Lienert et al., A 50-MHz Logarithmic Amplifier for Use in Lidar Measurements, Journal of Atmospheric and Oceanic Technology, V19, pp. 654-657, May 2002.

* cited by examiner

*Primary Examiner* — Long Nguyen
(74) *Attorney, Agent, or Firm* — Paradice and Li LLP (57) ABSTRACT

This disclosure provides systems, methods and apparatuses for processing analog signals with a wide dynamic range. In some implementations, the analog signal may be a current signal that is logarithmically scaled to decrease its dynamic range and converted to an output voltage using two or more diodes. A first diode may be used to scale a first range of the current signal and a second diode may be used to scale a second range of the current signal.

20 Claims, 6 Drawing Sheets

LIGHT DETECTION WITH LOGARITHMIC CURRENT-TO-VOLTAGE CONVERTER

TECHNICAL FIELD

This disclosure relates generally to light detection and ranging (LIDAR) devices, and specifically to logarithmic current-to-voltage converters used in LIDAR devices.

DESCRIPTION OF THE RELATED TECHNOLOGY

A LIDAR device may be used to develop a 3-D representation of a surrounding area. LIDAR devices may emit light (such as pulsed laser light) that is reflected by a number of objects, and then captured by a photodetector. The LIDAR device may measure the time of flight associated with the emitted and reflected light and then determine distances between the LIDAR device and the objects based on the time of flight data. In some implementations, the determined distances may be used to control and navigate autonomous vehicles, enable industrial machine control, or generate 3D mapping information for a variety of applications.

The photodetector may generate a current having a magnitude that is proportional to the intensity of received light pulses. For example, the photodetector may generate relatively small amounts of current (such as on the order a microamp or less) when little or no light is detected, and may generate relatively large amounts of current (such as on the order of 100s of milliamps) when a large amount of light is detected. Very reflective objects return many times more light than poorly reflective and/or non-reflective objects. As a result, many photodetectors have a relatively wide dynamic range of output current.

An analog-to-digital converter (ADC) may be used to convert analog signals generated by the photodetector into digital data that can be processed, for example, to determine distances and to generate 3D mapping information. However, ADCs having a resolution sufficient to handle the relatively wide dynamic range of photodetectors are complex and consume significant amounts of power.

Therefore, there is a need to reduce the complexity and power consumption of ADCs that sense signals generated by a photodetector having a relatively wide dynamic range without adversely affecting sensitivity or resolution.

SUMMARY

The systems, methods and devices of this disclosure each have several innovative aspects, no single one of which is solely responsible for the desirable attributes disclosed herein.

On innovative aspect of the subject matter described in this disclosure can be implemented within an apparatus to processes analog current signals. In some implementations, an apparatus may include an input terminal to receive an input current, a first circuit including a first diode configured to generate a first voltage based at least in part on a first portion of the input current, a second circuit including a second diode configured to generate a second voltage based at least in part on a second portion of the input current, and a voltage summer configured to generate an output voltage of the device based at least in part on a sum of the first voltage and the second voltage.

Another innovative aspect of the subject matter described in this disclosure can be implemented within a LIDAR device. In some implementations, the LIDAR device may include a light emitter to emit light into an environment, a photodetector to generate a current based at least in part on light received from the environment, and a logarithmic current-to-voltage converter comprising an input terminal to receive the current from the photodetector, a first circuit including a first diode to generate a first voltage based at least in part on the first portion of the current from the photodetector, a second circuit including a second diode to generate a second voltage based at least in part on the second portion of the current from the photodetector, and a voltage summer to generate an output voltage of the LIDAR device based at least in part on a sum of the first voltage and the second voltage.

Another innovative aspect of the subject matter described in this disclosure can be implemented as a method. In some implementations, the method comprises receiving a current comprising a first portion and a second portion, generating a first voltage, using a first diode, based at least in part on the first portion of the current, generating a second voltage, using a second diode, based at least in part on the second portion of the current; and generating an output voltage based at least in part on a sum of the first voltage and the second voltage.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

DETAILED DESCRIPTION

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system or network that is capable of transmitting, receiving, and processing light such as, for example, a reflected light pulses associated with a LIDAR device.

A LIDAR device typically includes a transmitter, a receiver, and digital processing circuitry. The transmitter may emit light pulses that are reflected by points or objects in a surrounding environment. The reflected light pulses may be detected by the receiver, which may determine intensity values of the received light pulses and convert the determined intensity values into digital data that can be processed by the digital processing circuitry. The receiver typically includes a number of photodetectors and a number of analog-to-digital converters (ADCs). The photodetectors, which may be reverse-biased photodiodes such as avalanche photodiodes, convert photons associated with the received light pulses into electrical signals having current levels indicative of intensity values of the received light pulses. These electrical signals typically have a wide dynamic range. For example, when responding to poorly reflective/non reflective objects the photodetector may produce relatively small output currents. In contrast, when responding to highly reflective objects, the photodetector may produce relatively large output currents. ADCs capable of sampling signals having such wide dynamic ranges are typically complex and consume significant amounts of power.

Implementations of the subject matter described in this disclosure may be used to compress the dynamic range of signals provided by photodetectors of a LIDAR receiver. In some implementations, a log-compressed processing circuit may logarithmically scale a signal provided by a photodetector before the signal is sampled by an ADC, for example, to allow the ADC to have a smaller dynamic range without sacrificing sampling resolution of the received light pulses. In some implementations, the log-compressed processing circuit may include a plurality of diodes to receive the signal, and each of the diodes may be configured for a different range of current levels. For example, a first diode may be used to generate an output voltage for signals having current levels less than a threshold, and a second diode may be used to generate an output voltage for signals having current levels greater than or equal to the threshold. In some aspects, a number of additional diodes may be used to generate output voltages for signals having a corresponding number of different intermediate ranges of current levels. The ability to separately process photodetector signals having different ranges of current levels may allow ADCs having smaller dynamic ranges to sample the photodetector signals without sacrificing sampling resolution, thereby reducing circuit complexity and power consumption.

Figure 1:
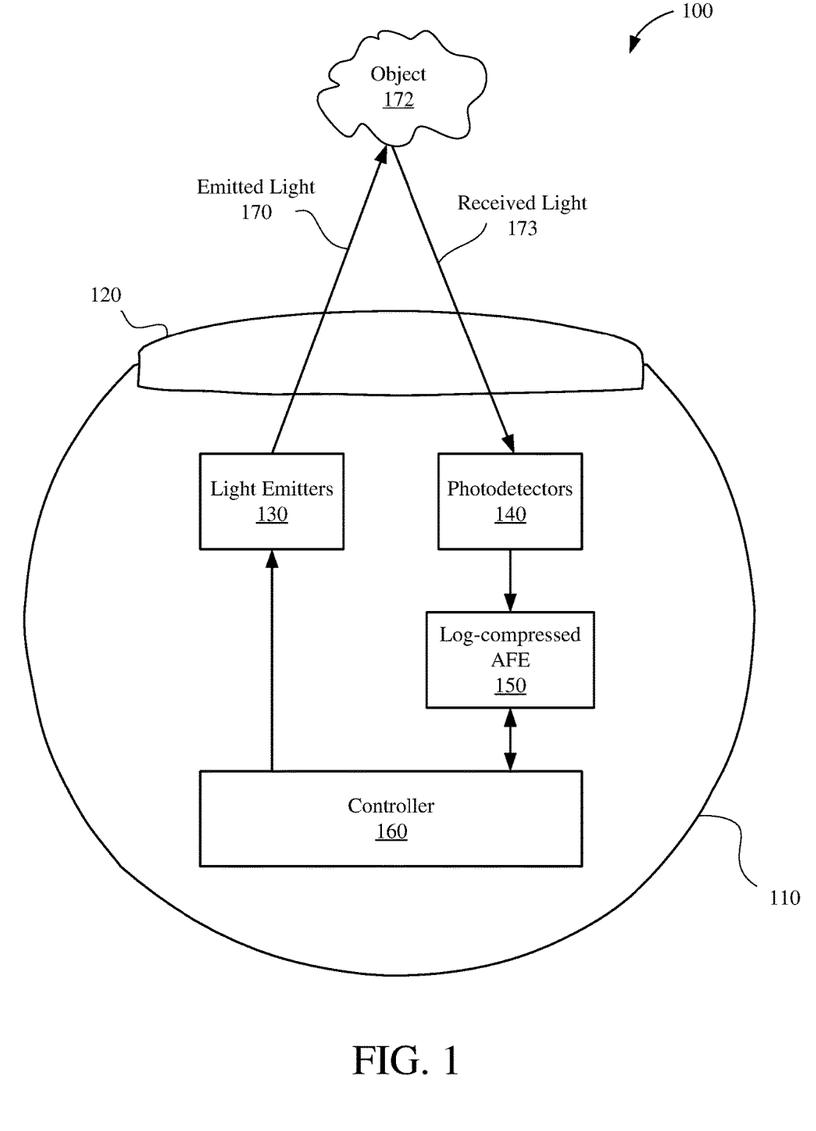
FIG. 1 shows a simplified diagram of an example light detection and ranging (LIDAR) device.

FIG. 1 shows a simplified diagram of an example LIDAR device 100. The LIDAR device 100 may be used to detect points or objects in an environment by emitting pulses of lights that illuminate the points or objects and detecting light pulses reflected from the points or objects. The LIDAR device 100 can determine the distance to a selected object based on the time delay between the emission of a light pulse and the reception of a corresponding light pulse reflected from the selected object. This time delay, which may also be referred to as the "time-of-flight" or the round-trip time of the light pulse, may be multiplied by the speed of light to determine the distance between the LIDAR device and the selected object. Distance information of a number of points associated with the selected object may be used to determine the location, size, shape, pose, and motion of the selected object. In this manner, the LIDAR device may scan its surrounding environment and use distance information to generate a map of the environment. In some implementations, the LIDAR device 100 may be used to control an autonomous vehicle, for example, so that the autonomous vehicle can navigate the environment to reach a destination while avoiding obstacles.

The example LIDAR device 100 is shown to include a housing 110, a lens 120, a number of light emitters 130, a number of photodetectors 140, a log compressed analog front-end (AFE) 150, and a controller 160. The housing 110 may protect one or more components of the LIDAR device 100 from damage from exposure to dust, water, wind borne debris, fingerprints, and other undesired elements. In some implementations, components of the LIDAR device 100 (such as the light emitters 130, the photodetectors 140, etc.) may be affixed to the housing 110. Further, in some aspects, the housing 110 may rotate, thereby enabling the LIDAR device 100 to gather information and provide a 360-degree view of the surrounding environment.

The light emitters 130 are coupled to the controller 160. The controller 160 may direct the light emitters 130 to emit light through the lens 120. In some implementations, the light emitters 130 may emit one or more light pulses that can be used to detect objects in the surrounding environment. The light emitters 130 may include any number of suitable light sources such as, for example, laser diodes, light emitting diodes (LEDs), vertical cavity surface emitting lasers (VCSEL), organic light emitting diodes (OLEDs), polymer light emitting diodes (PLED), light emitting polymers (LEP), liquid crystal displays (LCD), microelectromechanical systems (MEMS), or any other device configured to selectively transmit or emit light pulses at a source wavelength. The source wavelength may include, for example, the ultraviolet, visible, and/or infrared portions of the electromagnetic spectrum. In some aspects, the light emitters 130 may be disposed on one or more substrates (such as printed circuit boards (PCB), flexible PCBs, and the like).

The lens 120, which may be a relatively clear opening in the housing 110 that allows light to enter and exit the housing 110, may include any suitable components (such as mirrors, lenses, diffraction gratings, exit apertures, and the like) that can focus, direct, and/or condition light for emission into the surrounding environment). Emitted light 170 from the light emitters 130 may be reflected by an object 172 to generate reflected light 173 that may be received by the photodetectors 140. In some aspects, the lens 120 may include optics to filter wavelengths of the received light so that the photodetectors 140 primarily receive light corresponding to the wavelength of the light emitted by the light emitters 130 (and receive minimal light corresponding to other wavelengths).

The photodetectors 140 may be configured to convert the received light 173 into electrical signals (such as analog signals) indicative of the intensity level of the received light 173. The photodetectors 140 may be any suitable component or device that can receive or sense light including, for example, photodiodes, avalanche photodiodes, phototransistors, cameras, active pixel sensors (APS), charge coupled devices (CCD), cryogenic detectors, or the like. In at least one implementation, the photodetectors 140 are reverse-biased photodiodes that generate current in response to receiving light pulses, for example, such that the amount of generated current may be indicative of intensity levels of the received light pulses.

In some implementations, the photodetectors 140 may be sensitive to extreme ranges of light and dark and generate an output signal having a large dynamic range. For example, the photodetectors 140 may provide an output signal (e.g., an output voltage or output current) that ranges from a few microamps to 100s of milliamps or tens of microvolts to volts. Such a large range of output signals may be difficult to capture with conventional low-cost analog-to-digital converters.

The photodetectors 140 are coupled to the log-compressed AFE 150. The log-compressed AFE 150 may include one or more processing circuits (not shown for simplicity) to compress the dynamic range of the output signal from the photodetectors 140. In some implementations, the log-compressed AFE 150 may also include an analog-to-digital converter (ADC) (also not shown for simplicity) to digitize a log-compressed output signal from the photodetectors 140.

The controller 160 is coupled to the log-compressed AFE 150. The controller 160 may receive an output signal from the log-compressed AFE 150 based on signals generated by the photodetectors 140. The controller 160 may determine time of flight information for light emitted by the light emitter 130 and received by the photodetectors 140. The controller 160 may determine distances between the LIDAR device and various objects based at least in part on the time of flight information. In some implementations, the controller 160 may be (or may include) a digital signal processor (DSP) that can process digital data provided by the AFE 150 to determine the size, shape, and location of a number of detected objects in the surrounding environment, to generate 3D mapping information of the surrounding environment, and so on.

In some implementations, the housing 110 may rotate in a 360-degree manner and thereby provide information for objects surrounding the LIDAR device 100. In other implementations, the LIDAR device 100 may include one or more controllable mirrors (not shown for simplicity) that can direct emitted light 170 and/or reflected light 173 to and from the LIDAR device 100. By moving the controllable mirrors, the emitted and reflected light can be directed to scan an area without rotating the housing 110.

Figure 2:
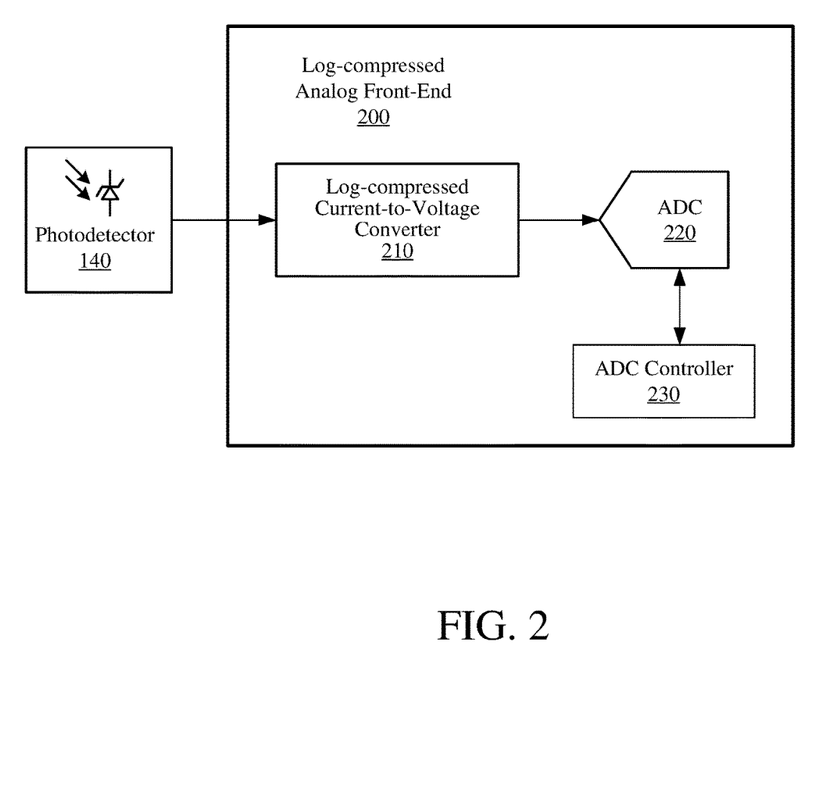
FIG. 2 is block diagram of an example log-compressed analog front end (AFE).

FIG. 2 is a block diagram of an example log-compressed analog front end (AFE) 200. The log-compressed AFE 200, which may be one implementation of the AFE 150 of FIG. 1, may include a log-compressed current-to-voltage converter 210, an analog-to-digital converter (ADC) 220, and an ADC controller 230. As shown in FIG. 2, the log-compressed AFE 200 may be coupled to the photodetectors 140.

The photodetectors 140 may include one or more components that generate an electrical signal in response to receiving (or detecting) light. For example, the photodetectors 140 may include one or more avalanche photodiodes that generate a current in response to receiving light 173, such as light emitted from the light emitters 130 and reflected by the object 172 of FIG. 1. A dark current of an avalanche photodiode (which may refer to the photodiode's output current when the photodiode is not receiving light) may be on the order of femtoamps or picoamps. In contrast, a photocurrent of an active avalanche photodiode (which may refer to the photodiode's output current when the photodiode is receiving significant light) may be on the order of 100s of milliamps. Thus, an output signal from the avalanche photodiode may have a large dynamic range.

The output signal from the photodetectors 140 is received by the log-compressed current-to-voltage converter 210. In some implementations, the log-compressed current-to-voltage converter 210 may include a transimpedance amplifier with a logarithmic response to input current. The ADC 220 may receive a voltage from the log-compressed current-to-voltage converter 210, and may generate a digital representation of the received voltage. The ADC 220 may be a flash ADC, a successive-approximation-register (SAR) ADC, a delta sigma ADC, or any other feasible type of ADC. The ADC controller 230 may control the ADC 220 by, for example, directing sample and conversion operations associated with the ADC 220. Data from the ADC 220 may be used to determine time of flight information as described above with respect to FIG. 1. In some implementations, data from the ADC 220 may be treated as log-compressed data by downstream processing (not shown for simplicity). In other words, the data from the ADC 220 may be treated as logarithmic data and not, for example, as linear data.

Diodes have a well-known logarithmic relationship between current and voltage. For example, a diode voltage $V_D$ may be related to a diode current $I_D$ by the equation shown below:

$$V_D = k \log\left(\left(\frac{I_D}{I_0}\right) + 1\right) \quad \text{(eq. 1)}$$

where $V_D$ is the diode voltage, $I_D$ is the diode current, k is a constant, and $I_0$ is a reference current. Persons skilled in the art will appreciate that $I_0$ may vary for different diodes included in the photodetector 140.

In some implementations, the log-compressed current-to-voltage converter 210 may use the logarithmic relationship described in eq. 1 to process signals generated by the photodetectors 140.

Figure 3A:
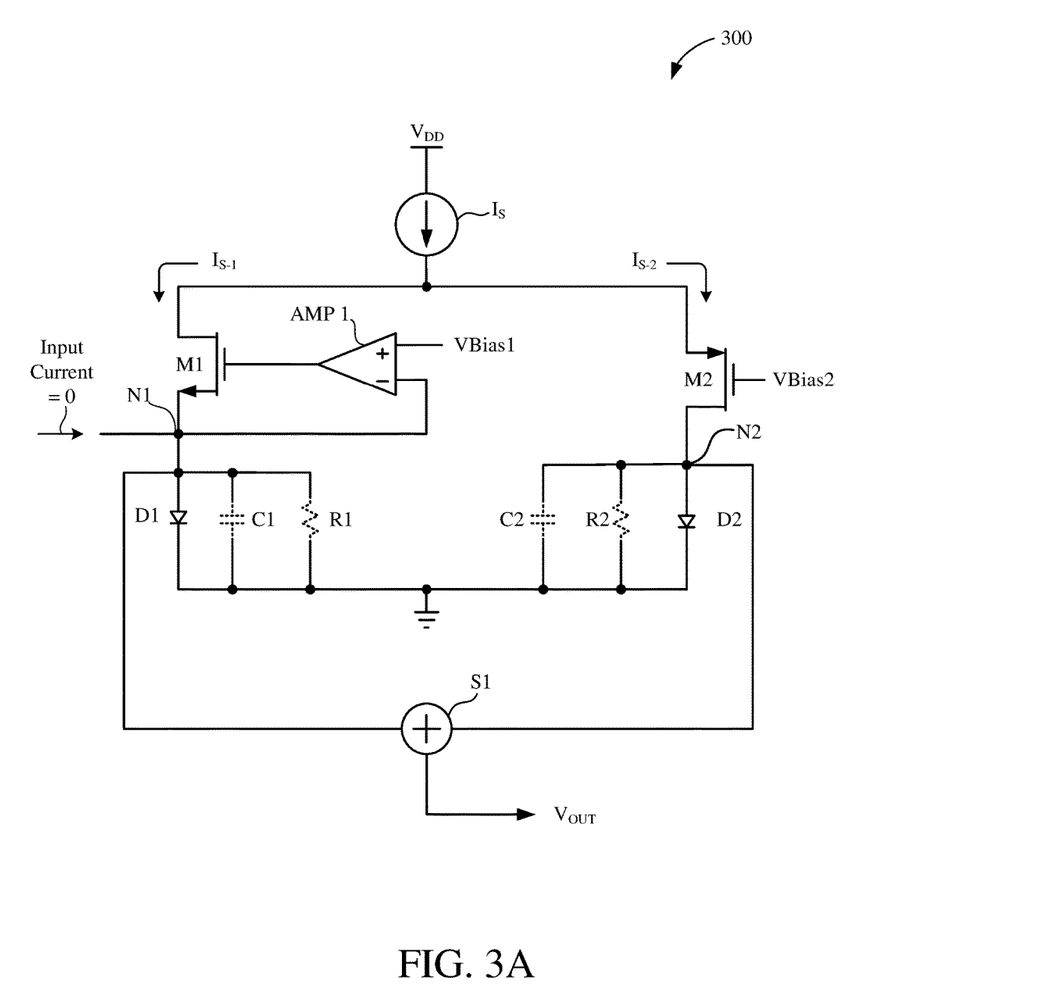
FIGS. 3A and 3B are simplified schematic diagrams of an example log-compressed current-to-voltage converter.

FIG. 3A is a simplified schematic diagram of an example log-compressed current-to-voltage converter 300 in the absence of an input current $I_{IN}$. The log-compressed current-to-voltage converter 300 may include a first transistor M1, a second transistor M2, a first diode D1, a second diode D2, a voltage summer S1, a current source $I_S$, and an amplifier AMP 1. A number of photodetectors (such as the photodetectors 140 of FIGS. 1 and 2) may be coupled to node N1, which may operate as an input terminal of the compressed current-to-voltage converter 300. The example log-compressed current-to-voltage converter 300 includes the first diode D1 and the second diode D2 for ease of explanation. Persons having skill in the art will appreciate that other suitable circuit elements may be used in place of the first diode D1 and/or the second diode D2. For example, a bipolar transistor, a MOSFET, or other circuit element with a similar voltage/current relationship (as expressed in eq. 1) may be used in place of the first diode D1 and/or the second diode D2.

FIG. 3A also illustrates parasitic capacitors and resistors (shown with dotted lines) that may be associated with one or more components in, or coupled to, the log-compressed current-to-voltage converter 300. For example, a first capacitor C may represent capacitance between node N1 and ground. Thus, the first capacitor C may include any parasitic capacitance associated with the first diode D1, as well as any capacitance (e.g., output capacitance) that may be associated with any external circuits including, but not limited to, the photodetectors 140. A first resistor R1 coupled to the node N1 may include parasitic resistances associated with the first diode D1 as well as any resistance (e.g., output resistance) that may be associated with any external circuits coupled to node N1. In a similar manner, a second capacitor C2 may represent any parasitic capacitances associated with the second diode D2, and a second resistor R2 may represent parasitic resistances associated with second diode D2.

The first transistor M1 may be an NMOS transistor that is biased, at least in part, by a first voltage VBias1. The first voltage VBias1 may be provided to a gate of the first transistor M1 through the amplifier AMP 1, for example, to operate the first transistor M1 in an active-cascode mode. The second transistor M2 may be a PMOS transistor that is biased, at least in part, by a second voltage VBias2 coupled to a gate of the second transistor M2. The bias voltages VBias1 and VBias2 may be generated in any technically feasible manner.

The current source $I_S$ provides a constant current that may be shared by the first transistor M1 and the second transistor M2. In some aspects, the current source $I_S$ may generate a current $I_{SOURCE}$ which includes a first current $I_{S-1}$ flowing through the first transistor M1 and a second current $I_{S-2}$ flowing through the second transistor M2.

$$I_{SOURCE}=I_{S-1}+I_{S-2} \quad \text{(eq. 2)}$$

The bias voltages VBias1 and VBias2 may be selected to allow the first transistor M1 and the second transistor M2 to conduct currents $I_{S-1}$ and $I_{S-2}$, respectively. When no input current is received from an external source (e.g., when the input current $I_{IN}$ is substantially 0), then the current through the first diode D1 is substantially equal to the value of the first current $I_{S-1}$. The voltage at node N1 may be expressed using eq. 1 above, for example, where the diode current $I_D$ is replaced by the first current $I_{S-1}$. Therefore, the voltage at node N1 may also be expressed as:

$$\text{Voltage}(N1) = k \log\left(\left(\frac{I_{S-1}}{I_0}\right)+1\right) \quad \text{(eq. 3)}$$

In a similar manner, the voltage at node N2 may be expressed as a function of the second current $I_{S-2}$:

$$\text{Voltage}(N2) = k \log\left(\left(\frac{I_{S-2}}{I_0}\right)+1\right) \quad \text{(eq. 4)}$$

The voltage summer S1 is coupled to the nodes N1 and N2, and may generate an output voltage $V_{OUT}$ by adding (or summing) together the voltages at nodes $N_1$ and N2. At quiescence when the input current $I_{IN}=0$, the output voltage $V_{OUT}$ may be expressed as:

$$V_{OUT} = k \log\left(\left(\frac{I_{S-1}}{I_0}\right)+1\right) + k \log\left(\left(\frac{I_{S-2}}{I_0}\right)+1\right) \quad \text{(eq. 5)}$$

As described above, when a photodetector 140 is coupled to node N1, the first resistor R1 includes resistances that may be associated with the first diode D1, as well as resistances associated with the photodetector 140. The effective resistance at node N1 is based on a combination of the resistance of the source of the transistor M1 and the resistance associated with the first diode D1. These resistances may vary as a function of bias and input signal.

Figure 3B:
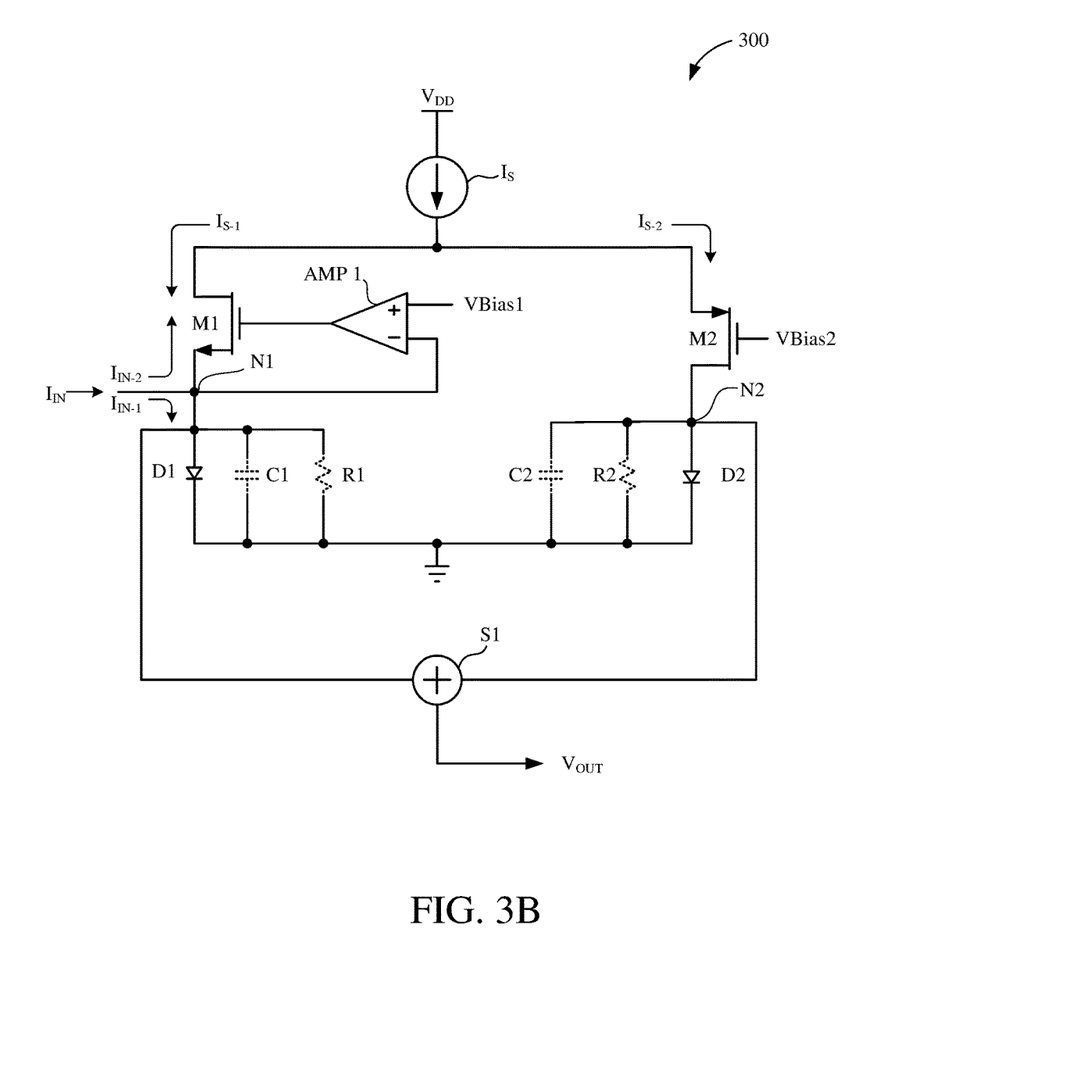

FIG. 3B illustrates an example operation of the log-compressed current-to-voltage converter 300 in the presence of an input current $I_{IN}$. During operation of the log-compressed current-to-voltage converter 300, the input current $I_{IN}$ provided by the photodetector 140 may be received through the node N1. The input current $I_{IN}$ may flow through a first current path (or circuit) and/or through a second current path (or circuit). The first current path may include the first diode D1, and the second current path may include the second diode D2. In some implementations, the second current path may also include the first transistor M1 and the second transistor M2. Thus, a first portion $I_{IN-1}$ of the input current $I_{IN}$ may flow through the first diode D1, and a second portion $I_{IN-2}$ of the input current $I_{IN}$ may flow through the first transistor M1.

The input current $I_{IN}$ may initially flow through the first transistor M1 (e.g., as $I_{IN-2}$). Thus, the current $I_{IN-2}$ is added to the current $I_{S-2}$ flowing through the second transistor M2 and the second diode D2. As a result, the voltage at the node N2 may be described as:

$$\text{Voltage}(N2) = k \log\left(\left(\frac{I_{S-2}+I_{IN-2}}{I_0}\right)+1\right) \quad \text{(eq. 7)}$$

As shown in eq. 7, the input current $I_{IN}$ (via the current $I_{IN-2}$) may be scaled logarithmically and converted to a voltage at node N2 to generate the output voltage $V_{OUT}$. In other words, as the input current $I_{IN}$ increases, the current $I_{IN-2}$ is directed through the second diode D2, thereby increasing the voltage of the node N2 to generate the output voltage $V_{OUT}$.

As the input current $I_{IN}$ increases, the current $I_{IN-2}$ may increase to a level such that $I_{IN-2}=I_{S-1}$. When $I_{IN-2}=I_{S-1}$, current flow through the first transistor M1 may decrease to zero (or to near zero), and additional input current $I_{IN-1}$ may flow primarily through the first diode D1, for example, such that the voltage at node N1 may be expressed as:

$$\text{Voltage}(N1) = k \log\left(\left(\frac{I_{IN-1}}{I_0}\right)+1\right) \quad \text{(eq. 8)}$$

Therefore, as the input current $I_{IN}$ increases to a level greater than the current $I_{S-1}$, the voltage contribution from the node N2 on the output voltage $V_{OUT}$ may become near constant, and the voltage contribution from the node N1 on the output voltage $V_{OUT}$ may steadily increase. In this manner, the input current $I_{IN}$ (via $I_{IN-1}$) may be scaled logarithmically and converted to a voltage at node N1 (as shown by eq. 8) to generate the output voltage $V_{OUT}$. In some implementations, smaller input currents generated by the photodetector 140 may be reflected by the voltage at the node N2, while larger input currents generated by the photodetector 140 may be reflected by the voltage at the node N1. For example, when input currents are less than $I_{S-1}$ (e.g., when $I_{IN-2}<I_{S-1}$), then the output voltage $V_{OUT}$ of the log-compressed current-to-voltage converter 300 may be based on changes in the voltage of node N2. Conversely, when input currents exceed $I_{S-1}$ (e.g., $I_{IN-2}>I_{S-1}$), then the output voltage $V_{OUT}$ of the log-compressed current-to-voltage converter 300 may be based on changes in the voltage of node N1. In this manner, the bias current $I_{S-1}$ may be used as a threshold, for example, such that input currents less than the bias current $I_{S-1}$ are converted to voltages through the second diode D2, and input currents greater than the bias current $I_{S-1}$ are converted to voltages through the first diode D1.

Although only two diodes D1 and D2 are shown in FIGS. 3A-3B, in other implementations, the example log-compressed current-to-voltage converter 300 may include a number of additional diodes or additional circuit elements. For example, three diodes may be used to process input currents using three different current levels ranges instead of the two current level ranges described above with respect to FIGS. 3A-3B. Further, although described in the context of processing signals generated by photodetectors, the log-compressed current-to-voltage converter 300 may be used to process any suitable analog current signals, especially those which may benefit from logarithmic scaling.

Notably, a first time constant associated with the first capacitor C1 and the first resistor R1 may be larger than a second time constant associated with the second capacitor C2 and the second resistor R2, for example, due in part to the additional capacitance and resistance associated with the photodetector 140 (or other circuitry associated with delivering the input current $I_{IN}$ to the log-compressed current-tovoltage converter 300). Therefore, the voltage of the node N2 may be associated with faster (e.g., higher frequency) current changes than the voltage of the node N1.

Figure 4:
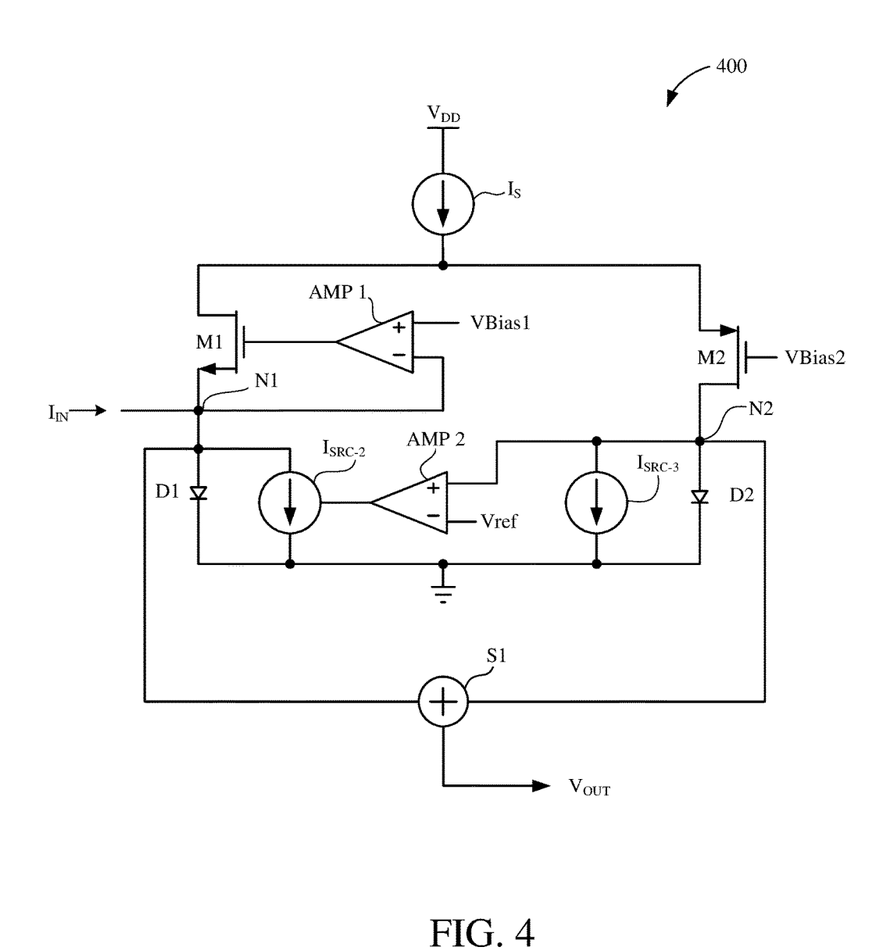
FIG. 4 is a simplified schematic diagram of another example log-compressed current-to-voltage converter.

FIG. 4 is a simplified schematic diagram of another example log-compressed current-to-voltage converter 400. Similar to the log-compressed current-to-voltage converter 300 of FIGS. 3A and 3B, the log-compressed current-to-voltage converter 400 may include a first transistor M1, a second transistor M2, a first diode D1, a second diode D2, a voltage summer S1, a current source $I_S$, and a first amplifier AMP 1 that may operate substantially similar to similarly referenced components of FIGS. 3A and 3B. In addition, the log-compressed current-to-voltage converter 400 may include a second current source $I_{SRC-2}$, a third current source $I_{SRC-3}$, and a second amplifier AMP 2. In some implementations, the second current source $I_{SRC-2}$ may be controlled at least in part by the second amplifier AMP 2, a reference voltage Vref, and the voltage at node N2. The second current source $I_{SRC-2}$ may allow for more precise control of the first bias current through the first diode D1. In some implementations, the third current source $I_{SRC-3}$ may be controlled at least in part by the voltage at the node N2. The third current source $I_{SRC-3}$ may allow for more precise control of the second bias current through the second diode D2. In this manner, the second current source $I_{SRC-2}$, the third current source $I_{SRC-3}$, and the second amplifier AMP 2 may provide additional control points to more precisely control bias currents of the log-compressed current-to-voltage converter 400. As described above with respect to FIGS. 3A and 3B, the first diode D and the second diode D2 may be replaced with any other suitable circuit elements.

Figure 5:
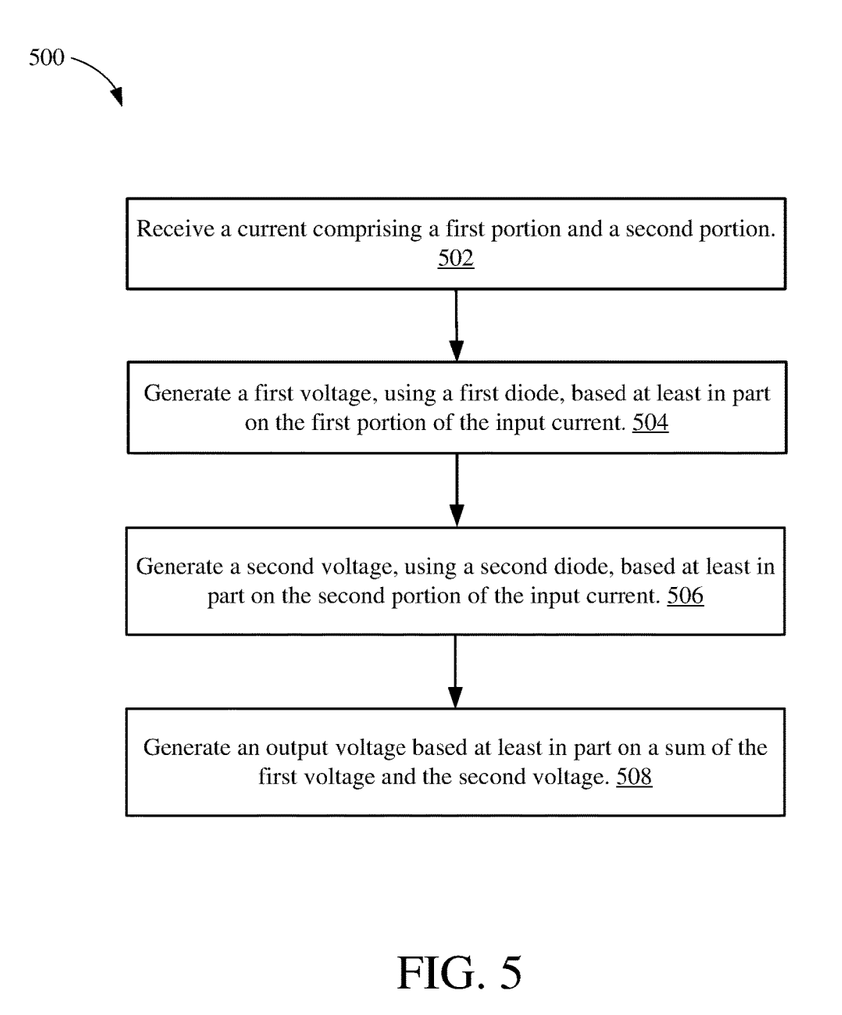
FIG. 5 shows an illustrative flow chart of an example operation for generating an output voltage.

FIG. 5 shows an illustrative flow chart of an example operation 500 for generating an output voltage. Although described below with respect to the log-compressed current-to-voltage converter 300 of FIGS. 3A and 3B, the example operation 500 may be performed by any other suitable current-to-voltage converter.

The log-compressed current-to-voltage converter 300 may receive a current comprising a first portion and a second portion (502). In some implementations, the log-compressed current-to-voltage converter 300 may receive the current from the photodetector 140, and the current may have a magnitude indicative of intensity values of light received by a LIDAR device.

The log-compressed current-to-voltage converter 300 may generate a first voltage, using a first diode, based at least in part on the first portion of the current (504). In some aspects, the first diode may generate the first voltage based on the current having a magnitude less than a threshold.

The log-compressed current-to-voltage converter 300 may generate a second voltage, using a second diode, based at least in part on the second portion of the current (506). In some aspects, the second diode may generate the second voltage based on the input current having a magnitude not less than the threshold.

The log-compressed current-to-voltage converter 300 may generate an output voltage based at least in part on a sum of the first voltage and the second voltage (508). In this manner, the current may be scaled logarithmically to generate the output voltage.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logic, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described throughout. Whether such functionality is implemented in hardware or software depends upon the particular application and design constraints imposed on the overall system.

The apparatus described herein used to implement the various illustrative logic, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices (such as a combination of a DSP and a microprocessor, a plurality of microprocessors, one or more microprocessors in conjunction with a DSP core, or any other such configuration). In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A device, comprising:
    an input terminal to receive an input current;
    a first circuit including a first circuit element configured to generate a first voltage based at least in part on a first portion of the input current;
    a second circuit including a second circuit element configured to generate a second voltage based at least in part on a second portion of the input current; and
    a voltage summer configured to generate an output voltage of the device based at least in part on a sum of the first voltage and the second voltage.

2. The device of claim 1, wherein the first voltage is based at least in part on a logarithmic relationship between the first portion of the input current and a reference current.

3. The device of claim 1, wherein the first circuit element is configured to generate the first voltage based on the input current having a magnitude less than a threshold, and the second circuit element is configured to generate the second voltage based on the input current having a magnitude not less than the threshold.

4. The device of claim 3, wherein the threshold is based at least in part on a bias current through the first circuit element.

5. The device of claim 1, wherein the first and the second circuit elements are diodes.

6. The device of claim 1, wherein the first and the second circuit elements have a logarithmic relationship between a current and a voltage associated with each circuit element.

7. The device of claim 1, further comprising:
    a current source to provide a first current for the first circuit and to provide a second current for the second circuit.

8. The device of claim 7, where the first voltage is based at least in part on the first current provided by the current source and the first portion of the input current, and the second voltage is based at least in part on the second current provided by the current source and the second portion of the input current.

9. The device of claim 7, further comprising a first transistor to provide at least a portion of the first current to the first circuit element.

10. The device of claim 9, further comprising an amplifier configured to operate the first transistor in an active cascode mode.

11. The device of claim 9, further comprising a second transistor to provide at least a portion of the second current to the second circuit element.

12. A light detection and ranging (LIDAR) device comprising:
    a light emitter to emit light into an environment;
    a photodetector to generate a current based at least in part on light received from the environment; and
    a logarithmic current-to-voltage converter comprising:
        an input terminal to receive the current from the photodetector,
        a first circuit including a first circuit element to generate a first voltage based at least in part on a first portion of the current from the photodetector;
        a second circuit including a second circuit element to generate a second voltage based at least in part on a second portion of the current from the photodetector; and
        a voltage summer to generate an output voltage of the LIDAR device based at least in part on a sum of the first voltage and the second voltage.

13. The LIDAR device of claim 12, wherein the first circuit element is configured to generate the first voltage when a magnitude of the current from the photodetector is less than a threshold, and the second circuit element is configured to generate the second voltage when the magnitude the current from the photodetector is not less than the threshold.

14. The LIDAR device of claim 13, wherein the threshold is based at least in part on a bias current through the first circuit element.

15. The LIDAR device of claim 12, wherein the first and the second circuit elements are diodes.

16. The LIDAR device of claim 12, wherein the first and the second circuit elements have a logarithmic relationship between a current and a voltage associated with each circuit element.

17. The LIDAR device of claim 12, further comprising:
    a current source to provide a first current for the first circuit and to provide a second current for the second circuit; and
    a first transistor to provide at least a portion of the first current to the first circuit element.

18. A method comprising:
    receiving a current comprising a first portion and a second portion;
    generating a first voltage, using a first circuit element, based at least in part on the first portion of the current;
    generating a second voltage, using a second circuit element, based at least in part on the second portion of the current; and
    generating an output voltage based at least in part on a sum of the first voltage and the second voltage.

19. The method of claim 18, wherein the first circuit element is configured to generate the first voltage when a magnitude of the current is less than a threshold, and the second circuit element is configured to generate the second voltage when the magnitude of the current is not less than the threshold.

20. The method of claim 19, wherein the first and the second circuit elements are diodes.

* * * * *